(12) United States Patent
Hashemi et al.

(10) Patent No.: US 12,527,231 B2
(45) Date of Patent: Jan. 13, 2026

(54) MRAM STRUCTURE WITH CHIRAL SPIN-ORBIT-TORQUE METAL ELECTRODE

(71) Applicant: International Business Machines Corporation, Armonk, NY (US)

(72) Inventors: Pouya Hashemi, Purchase, NY (US); Jonathan Zanhong Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 594 days.

(21) Appl. No.: 17/953,800

(22) Filed: Sep. 27, 2022

(65) Prior Publication Data

US 2024/0107896 A1    Mar. 28, 2024

(51) Int. Cl.
| | |
|---|---|
| *H10B 61/00* | (2023.01) |
| *H10N 50/01* | (2023.01) |
| *H10N 50/10* | (2023.01) |
| *H10N 50/80* | (2023.01) |
| *H10N 52/00* | (2023.01) |
| *H10N 52/01* | (2023.01) |
| *H10N 52/80* | (2023.01) |

(52) U.S. Cl.
CPC ............ *H10N 52/80* (2023.02); *H10B 61/00* (2023.02); *H10N 52/00* (2023.02); *H10N 52/01* (2023.02)

(58) Field of Classification Search
CPC ........ H10N 50/10; H10N 50/80; H10N 52/80; H10N 52/00; H10N 52/01; H10B 61/00
See application file for complete search history.

(56) References Cited

U.S. PATENT DOCUMENTS

| | | | |
|---|---|---|---|
| 4,673,475 A | 6/1987 | Windischmann | |
| 10,242,989 B2 | 3/2019 | Pandey et al. | |
| 10,891,999 B1 | 1/2021 | Mihajlovic et al. | |
| 11,151,439 B2 | 10/2021 | Ouyang et al. | |
| 11,158,672 B2 | 10/2021 | Sonobe | |
| 11,189,782 B2 | 11/2021 | Doris et al. | |
| 2015/0041934 A1* | 2/2015 | Khvalkovskiy | H10N 50/10 257/421 |

(Continued)

FOREIGN PATENT DOCUMENTS

| | | |
|---|---|---|
| CN | 113056826 A | 6/2021 |
| CN | 114270519 A | 4/2022 |

(Continued)

OTHER PUBLICATIONS

Sanz-Hernandez, D., et al., "Artificial Double-Helix for Geometrical Control of Magnetic Chirality", ACS Nano Jul. 2020, pp. 8084-8092, 14.
Hentschel, M., et al., "Chiral plasmonics", Sci. Adv. May 17, 2017, , 12 pages, 3.
Hu, G., et al., "2X reduction of STT-MRAM switching current using double spin-torque magnetic tunnel junction", 2021 IEEE International Electron Devices Meeting (IEDM), Date of Conference: Dec. 11-16, 2021, pp. 2.5.1 to 2.5.4.

(Continued)

*Primary Examiner* — Omar F Mojaddedi
(74) *Attorney, Agent, or Firm* — Scully, Scott, Murphy & Presser, P.C.; Yuanmin Cai (57) ABSTRACT

A magnetoresistive random access memory (MRAM) structure is provided that includes a chiral spin-orbit-torque (SOT) metal bottom electrode under the bottom magnetic free layer where the chiral SOT metal bottom electrode is surrounded by a via dielectric. The chiral SOT metal bottom electrode enables the charge current, spin current and spin polarization directions to be in the same direction which is perpendicular to the surface of the chiral SOT via structure.

15 Claims, 6 Drawing Sheets

(56) References Cited

U.S. PATENT DOCUMENTS

| | | | |
|---|---|---|---|
| 2018/0033954 A1* | 2/2018 | Aradhya | H10N 52/00 |
| 2018/0358542 A1* | 12/2018 | Mihajlovic | H10N 50/85 |
| 2019/0304525 A1* | 10/2019 | Manipatruni | H10N 50/85 |
| 2020/0006627 A1* | 1/2020 | Manipatruni | H10N 50/80 |
| 2020/0006635 A1 | 1/2020 | Rahman et al. | |
| 2020/0083427 A1* | 3/2020 | Manipatruni | H10N 50/10 |

FOREIGN PATENT DOCUMENTS

| | | |
|---|---|---|
| CN | 119949076 A | 5/2025 |
| GB | 2636021 A | 6/2025 |
| WO | 2024/067060 A1 | 4/2024 |

OTHER PUBLICATIONS

Harinarayana, V., et al., "Two-photon lithography for three-dimensional fabrication in micro/nanoscale regime: A comprehensive review", Optics & Laser Technology, Apr. 2021, 25 pages, 142, 107180.

Sato, N., et al., "Two-terminal spin-orbit torque magnetoresistive random access memory", Nature Electronics, Sep. 2018, pp. 508-511, vol. 1.

International Search Report dated Nov. 23, 2023, received in a corresponding foreign application namely International Application No. PCT/Cn2023/118195, 10 pages.

* cited by examiner

MRAM STRUCTURE WITH CHIRAL SPIN-ORBIT-TORQUE METAL ELECTRODE

BACKGROUND

The present application relates to a memory structure, and more particularly to a magnetoresistive random access memory (MRAM) structure including a chiral spin-orbit-torque (SOT) metal bottom electrode (i.e., chiral SOT via structure).

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier layer). One of the two plates (i.e., the magnetic reference or pinned layer) is a magnet whose magnetic moment direction is set to a particular direction; the other plate's (i.e., the magnetic free layer's) magnetization can be changed in at least two different directions, representing different digital states such as 0 and 1 for memory applications. In MRAMs, such elements may be referred to as a magnetic tunnel junction (MTJ) structure. In a typical MTJ structure, the magnetization of the magnetic reference layer is fixed in one direction (say pointing up), while the direction of the magnetic free layer can be "switched" by some external forces, such as a magnetic field or a spin-transfer torque generating charge current. A smaller current (of either polarity) can be used to read the resistance of the device, which depends on the relative orientations of the magnetizations of the magnetic free layer and the magnetic reference layer. The resistance is typically higher when the magnetizations are anti-parallel, and lower when they are parallel (though this can be reversed, depending on the material).

One type of MRAM that can use a MTJ structure is spin-transfer torque (STT) MRAM. STT MRAM has the advantages of lower power consumption and better scalability over conventional MRAM which uses magnetic fields to flip the active elements. In STT MRAM, spin-transfer torque is used to flip (switch) the orientation of the magnetic free layer. For an STT MRAM device, a current passing through the MTJ structure is used to switch, or "write" the bit-state of the MTJ memory element. A current passing down through the MTJ structure makes the magnetic free layer parallel to the magnetic reference layer, while a current passed up through the MTJ structure makes the magnetic free layer anti-parallel to the magnetic reference layer.

SUMMARY

A MRAM structure is provided that contains a chiral SOT metal bottom electrode (i.e., a chiral SOT via structure) under the bottom magnetic free layer where the chiral SOT metal bottom electrode is surrounded by a via dielectric. The chiral SOT metal bottom electrode enables the charge current, spin current and spin polarization directions to be in the same direction which is perpendicular to the surface of the chiral SOT via structure. This makes the SOT assistance more efficient than in prior art MRAMs containing SOT metals where spin-current is polarized perpendicular to the direction of its' transmission.

In one aspect of the present application, a memory structure is provided. In one embodiment, the memory structure includes a chiral SOT metal bottom electrode, a via dielectric material structure located laterally adjacent to the chiral SOT metal bottom electrode, a MTJ structure located on top of the chiral SOT metal bottom electrode, wherein a magnetic free layer of the MTJ structure is located beneath a magnetic reference layer of the MTJ. The memory structure further includes a top electrode located on top of the MTJ structure.

In embodiments of the present application, the chiral SOT metal bottom electrode enables each of a charge current direction, a spin current direction and a spin polarization direction to be perpendicular to a horizontal surface of the chiral SOT metal bottom electrode. Such a chiral SOT under-layer structure can create a spin-current with non-zero perpendicular spin-polarization (due to the increase of the tilted interface orientation following the spiral-shaped growth). This creates a net spin-accumulation with polarization perpendicular to the surface of the chiral SOT metal bottom electrode, which is then coupled into the free-layer perpendicularly magnetized nanomagnet for initiating or assisting spin-current induced switching. This makes the SOT assistance more efficient than the prior art where spin-current is polarized perpendicular to the direction of its' transmission.

In embodiments of the present application, the chiral SOT metal bottom electrode is a via structure. The via structure allows for forming the needed graded-tilt interfaces of the chiral SOT metal structure for efficient conversion of charge current to spin current with sizable perpendicular polarization. Further, the via structure under the MTJ can help to eliminate any possible partial shunting of the MTJ tunneling barrier during a patterning process.

In embodiments of the present application, each of the chiral SOT metal bottom electrode, the MTJ structure and the top electrode can be cylindrical in shape.

In embodiments of the present application, the magnetic free layer of the MTJ structure has a width that differs from a width of the chiral SOT metal bottom electrode, while in other embodiments, the magnetic free layer of the MTJ structure has a width that is substantially equal to a width of the chiral SOT metal bottom electrode.

In embodiments of the present application, the memory structure further includes an interconnect level including an interconnect dielectric material layer and an electrically conductive structure located beneath the chiral SOT metal bottom electrode, wherein the chiral SOT metal bottom electrode is located on a surface of the electrically conductive structure. In such embodiments, the interconnect dielectric material layer has a notched surface located adjacent to the electrically conductive structure, and wherein the via dielectric material structure is located on the notched surface of the interconnect dielectric material layer.

In embodiments of the present application, the chiral SOT metal bottom electrode is composed of a bi-layer or multi-layer thin film structure, deposited into a pre-opened via recess, to enable tilted interfaces. The materials of the layers are chosen to be strong in SOT charge-to-spin conversion at their interfaces, and with at least one layer having very high spin-current conductivity to propagate the interface-generated spin-current towards the free-layer of the switching nanomagnet. In embodiments of the present application, examples of such chiral SOT metal bottom electrode bi- or multi-layer structures can be constructed using the form A/B, or A/I/B, where A=β-Ta, β-W, $Cu_xPt_{1-x}$, $Cu_{1-x}Ta_x$, $Pd_xPt_{1-x}$, $Au_xPt_{1-x}$, Pt, $Bi_2Se_3$, $WTe_2$, $PtTe_2$, $TaS_2$, $Pt_xRh_{1-x}$ or any materials known to produce large SOT charge-to-spin conversion efficiency, x is from 0 to 1; and B=Cu, Ag, Au . . . are known good spin-conductors, and with 'I' being a poor charge-conductor, but good spin-conductor such as NiO, FeOx, and other magnon-mediated spin-conducting, but charge insulating, ferro- ferri- or antiferro-magnetic materials. The I-layer in this case is used as an interface layer between A and B to facilitate spin-conduction but prevent charge-current shunting.

In embodiments of the present application, the structure further includes a passivation layer located on a sidewall of each of the top electrode, the MTJ structure, and the chiral SOT metal bottom electrode. In such embodiments, the structure further includes a dielectric fill material located on the passivation layer, wherein the dielectric fill material has a topmost surface that is coplanar with a topmost surface of the top electrode.

In embodiments of the present application, the structure further includes an interconnect dielectric material layer located above the top electrode, wherein an electrically conductive structure is embedded in the interconnect dielectric material layer, and the electrically conductive structure contacts a surface of the top electrode. In such embodiments, the electrically conductive structure has a width that differs from a width of the top electrode, or the electrically conductive structure has a width that equals a width of the top electrode.

In another embodiment of the present application, the memory structure includes an interconnect level including at least one first electrically conductive structure embedded in a first interconnect dielectric material layer, wherein the first interconnect dielectric material has a notched surface adjacent to the at least one first electrically conductive structure. The memory structure further includes a chiral SOT metal bottom electrode located on surface of the at least one first electrically conductive structure, a via dielectric material structure located laterally adjacent to the chiral SOT metal bottom electrode and contacting the notched surface of the first interconnect dielectric material layer, and a MTJ structure located on top of the chiral SOT metal bottom electrode, wherein a magnetic free layer of the MTJ structure is located beneath a magnetic reference layer of the MTJ. The memory structure further includes a top electrode located on top of the MTJ structure, and at least one second electrically conductive structure embedded in a second interconnect dielectric material layer that is located on top of the top electrode, wherein the least one second electrically conductive structure contacts the top electrode.

In this another embodiment, the chiral SOT metal bottom electrode enables each of a charge current direction, a spin current direction and a spin polarization direction to be a perpendicular to a horizontal surface of the chiral SOT metal bottom electrode.

In this another embodiment, the chiral SOT metal bottom electrode is a via structure.

In this another embodiment, each of the chiral SOT metal bottom electrode, the MTJ structure and the top electrode is cylindrical.

In this another embodiment, the magnetic free layer of the MTJ structure has a width that differs from a width of the chiral SOT metal bottom electrode, or the magnetic free layer of the MTJ structure has a width that is substantially equal to a width of the chiral SOT metal bottom electrode.

In another aspect of the present application, a method of forming a memory structure is provided. In one embodiment of the present application, the method includes forming an interconnect level including at least one electrically conductive structure embedded in an interconnect dielectric material layer, forming at least one sacrificial dielectric material layer via structure on the interconnect dielectric material layer, while leaving the at least one electrically conductive structure physically exposed, and forming a layer of chiral SOT metal on the physically exposed at least one electrically conductive structure, wherein the forming of the layer of chiral SOT metal includes depositing the chiral SOT metal by physical vapor deposition, wherein the depositing is performed while rotating (in a same rotational direction) the interconnect level and the at least one sacrificial dielectric material layer via structure.

The method of the present application can further include planarizing the layer of chiral SOT metal to provide a precursor chiral SOT metal bottom electrode, and patterning the layer of precursor chiral SOT metal bottom electrode to provide a chiral SOT metal bottom electrode, wherein during the patterning a notched surface is formed in the interconnect dielectric material layer. This step removes the at least one sacrificial dielectric material layer via structure from the structure.

The method of the present application can further include forming a via dielectric material structure on the notched surface of the interconnect dielectric material layer and laterally adjacent to the chiral SOT bottom electrode.

The method of the present application can further include forming a MTJ structure and a top electrode on top of the chiral SOT metal bottom electrode, wherein the MTJ structure is positioned between the chiral SOT metal bottom electrode and the top electrode and wherein a magnetic free layer of the MTJ structure is located beneath a magnetic reference layer of the MTJ structure.

BRIEF DESCRIPTION OF THE DRAWINGS

FIG. 3A-3B are different views of the exemplary structure shown in FIG. 2 after patterning the sacrificial dielectric material layer into at least one sacrificial dielectric material via structure, FIG. 3A is a top down view and FIG. 3B is a cross sectional view along X-X shown in FIG. 3A.

FIG. 10 is a cross sectional view of the exemplary structure shown in FIG. 9 after patterning the magnetic material-containing stack to provide a patterned stack that is composed of a remaining unetched portion of the blanket layer of the magnetic free material (hereinafter referred to as a magnetic free layer), a remaining unetched portion of the blanket layer of the tunnel barrier material (hereinafter referred to as a tunnel barrier layer), a remaining unetched portion of the blanket layer of the magnetic reference material (hereinafter referred to as a magnetic reference layer), and a remaining unetched portion of the blanket layer of the top electrode material (hereinafter referred to as a top electrode); in this embodiment the magnetic free layer has a width that is smaller than a width of the chiral SOT metal bottom electrode.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Complementary metal oxide semiconductor (CMOS) integration desires to have a simple, two-terminal memory bit drivable by field effect transistors (FETs) with limited current (<<100 µA). A category of methods being proposed to improve the MTJ-based memory bit is to use SOT to generate more spin-current to assist the switching of the MTJ under a limited supply of charge current. A key challenge of SOT generated spin-current is to provide such with a spin-polarization in the direction of a perpendicularly magnetized magnetic free layer. However, normal SOT generates a spin-current that is polarized perpendicular to the direction of its' transmission direction, making the SOT assistance less efficient.

The present application solves the aforementioned problem with SOT containing MTJs by providing a chiral via SOT structure as a bottom metal electrode. The chiral via SOT structure of the present application generates a spin-current with its' spin-polarization direction significantly along the current propagation direction and has a large conversion efficiency for charge-to-spin current conversion. It is therefore efficient in creating a spin-current with axially polarized spins along the via axis. This is achieved by a multi-layered transport structure forming a spiral-pattern for both charge and spin-current conduction. The chiral-via structure is composed of a bi- or multi-layered structure in the form of A/B or A/I/B, where A=β-Ta, β-W, $Cu_xPt_{1-x}$, $Cu_{1-x}Ta_x$, $Pd_xPt_{1-x}$, $Au_xPt_{1-x}$, Pt, $Bi_2Se_3$, $WTe_2$, $PtTe_2$, $TaS_2$, $Pt_xRh_{1-x}$ or any materials known to produce large SOT charge-to-spin conversion efficiency, x is from 0 to 1; and B=Cu, Ag, Au . . . are known good spin-conductors, and with 'I' as a poor charge-conductor, but good spin-conductor such as NiO, FeOx, and other magnon-mediated spin-conducting, but charge insulating, ferro- ferri- or antiferro-magnetic materials. The I-layer in this case is used as an interface layer between A and B to facilitate spin-conduction but prevent charge-current shunting. The gradually increased tilt of the A/B or A/I/B interface normal creates a gradient for spin-current to accumulate a significant component with axial (to the spiral) spin-polarization, thus achieving high-efficiency conversion for charge-current to axially polarized spin-current which is important for efficient switching of perpendicularly magnetized nanomagnet built above the chiral-via structure.

Figure 1:
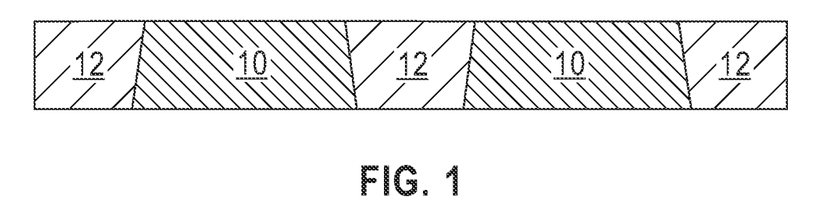
FIG. 1 is a cross sectional view on an exemplary structure that can be used in accordance with an embodiment of the present application, the exemplary structure including an interconnect level including at least one first electrically conductive structure embedded in a first interconnect dielectric material layer.
Figure 3A:
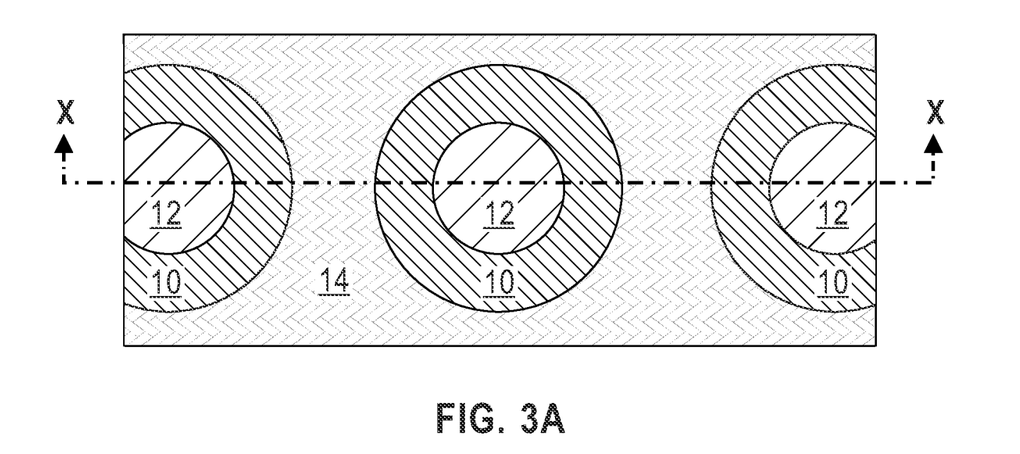

Referring first to FIG. 1, there is illustrated an exemplary structure that can be used in accordance with an embodiment of the present application; note that all cross sectional views including the one illustrated in FIG. 1 are along X-X shown in FIG. 3A. The exemplary structure includes an interconnect level including at least one first electrically conductive structure 12 (three are shown by way of one example in the drawings of the present application) embedded in a first interconnect dielectric material layer 10.

The interconnect level illustrated in FIG. 1 can be located above at least one underlying metal level (not shown) and a front-end-of-the-level (FEOL) also not shown. In some embodiments, the metal level can be a middle-of-the line (MOL) level. In other embodiments, the metal level can be at least one lower interconnect level of a multi-level interconnect structure. In yet further embodiments, the metal level can be a combination of a MOL level and at least one lower interconnect level of a multi-level interconnect structure. The metal level can include bottom electrically conductive structures embedded in a dielectric material layer. The FEOL can include a semiconductor substrate having one or more semiconductor devices (such as, for example, transistors) formed thereon. The metal level and the FEOL can be formed utilizing materials and techniques that are well known to those skilled in the art. So not to obscure the memory structure of the present application, the materials and techniques used in providing the metal level and the FEOL are not described in the present application.

The first interconnect dielectric material layer 10 can be composed of any interconnect dielectric material including, for example, silicon oxide (SiOx), silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first interconnect dielectric material layer 10 can have a dielectric constant (all dielectric constants mentioned herein are measured relative to a vacuum, unless otherwise stated) that is about 4.0 or less. In one embodiment, the first interconnect dielectric material layer 10 has a dielectric constant of 2.8 or less. These dielectrics generally having a lower parasitic cross talk as compared to dielectric materials whose dielectric constant is greater than 4.0. The first interconnect dielectric material layer 10 can be formed by a deposition process such as, for example, chemical vapor deposition (CVD), plasma enhanced chemical vapor deposition (PECVD) or spin-on coating. The first interconnect dielectric material layer 10 can have a thickness from 50 nm to 250 nm. Other thicknesses that are lesser than 50 nm, and greater than 250 nm can also be employed in the present application as the thickness of the first interconnect dielectric material layer 10.

The at least one first electrically conductive structure 12 can be composed of an electrically conductive metal or electrically conductive metal alloy. Illustrative examples of electrically conductive materials that can be used in the present application to provide that at least one first electrically conductive structure 12 include, but are not limited to, Cu, Al, Cu—Al alloy, W, Ru, or Rh. The at least one first electrically conductive structure 12 typically is cylindrical in shape as is apparent from the top down view shown in FIG. 3A. Although the at least one first electrically conductive structure 12 is illustrated as being cylindrical in shape, the shape of the at least one first electrically conductive structure 12 is not limited to cylindrical.

In some embodiments, a diffusion barrier liner (not shown) can be present along at least a sidewall (and in some embodiments along a bottom wall) of the at least one electrically conductive structure 12. When present, the diffusion barrier liner can be composed of any well-known diffusion barrier material such as, for example, Ta, TaN, Ti, TiN, W or WN. In some embodiments, the diffusion barrier liner can include a material stack of two or more diffusion barrier materials. In one example, the diffusion barrier liner can be composed of a stack of Ta/TaN or a stack of Ti/TiN.

The exemplary structure shown in FIG. 1 can be formed by first depositing the first interconnect dielectric material layer 10. Next, at least one opening is formed into the first interconnect dielectric material layer 10 by lithography and etching. Lithography includes forming a photoresist material on a surface of a material layer or structure that needs to be patterned, exposing the deposited photoresist material to a pattern of irradiation and thereafter developing the exposed photoresist material. The etching used in providing the at least one opening into the first interconnect dielectric material layer 10 can include a dry etching process (i.e., reactive ion etching, plasma etching or ion beam etching) or a chemical wet etch. Next, and if present, a layer of diffusion barrier material can be formed in the at least opening and atop the first interconnect dielectric material layer 10. The forming of the layer of diffusion barrier material includes a deposition process such as, for example, CVD, PECVD, physical vapor deposition (PVD) or atomic layer deposition (ALD). The layer of diffusion barrier material does not fill in an entirety of the at least one opening. Next, one of the above mentioned electrically conductive materials (e.g., Cu) is then deposited on the layer of diffusion barrier material. The deposition of the electrically conductive material can include CVD, PECVD, PVD, ALD, sputtering or plating. A planarization process such as, for example, chemical mechanical polishing (CMP), is then performed to remove the layer of diffusion barrier material (if the same is present) and the electrically conductive material that is formed outside of the at least one opening and on top of the first interconnect dielectric material layer 10. The electrically conductive material and, if present, the layer of diffusion barrier material remain in the opening after the planarization process. The electrically conductive material that remains in the opening provides first electrically conductive structure 12 and, if present, the diffusion barrier material layer that remains in the opening provides the diffusion barrier liner (not shown in FIG. 1). In embodiments of the present application, the at least one first electrically conductive structure 12 has a topmost surface that is coplanar with at least a topmost surface of the first interconnect dielectric material layer 10; if a diffusion barrier liner is present, the topmost surface of the at least one first electrically conductive structure 12 can also be coplanar with a topmost surface of the diffusion barrier layer as well as with a topmost surface of the first interconnect dielectric material layer 10.

Figure 2:
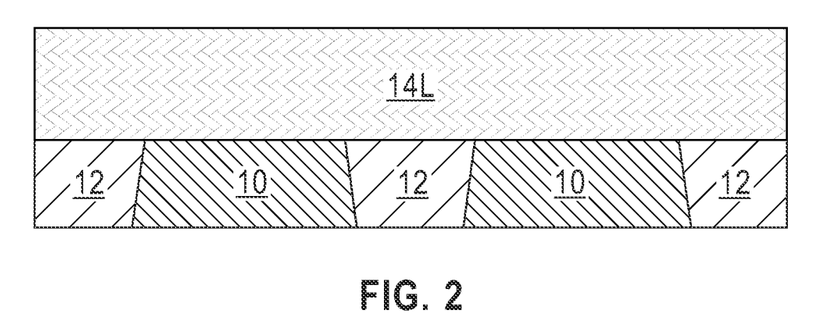
FIG. 2 is a cross sectional view of the exemplary structure shown in FIG. 1 after forming a sacrificial dielectric material layer on the interconnect level.

Referring now to FIG. 2, there is illustrated the exemplary structure shown in FIG. 1 after forming a sacrificial dielectric material layer 14L on the interconnect level. As is shown, the sacrificial dielectric material layer 14L is formed on the first interconnect dielectric material layer 10 and the at least one first electrically conductive structure 12. The sacrificial dielectric material layer 14L includes a dielectric material that is compositionally different from the dielectric material that provides the first interconnect dielectric material layer 10. In one example, the sacrificial dielectric material layer 14L is composed of silicon nitride (SiN) or silicon oxynitride (SiON). The sacrificial dielectric material layer 14L can be formed by a deposition process such as, for example, CVD, PECVD, PVD or ALD. The sacrificial dielectric material layer 14L can have a thickness of from 20 nm to 200 nm, although other thicknesses are contemplated and can be used as the thickness of the sacrificial dielectric material layer 14L.

Figure 3B:
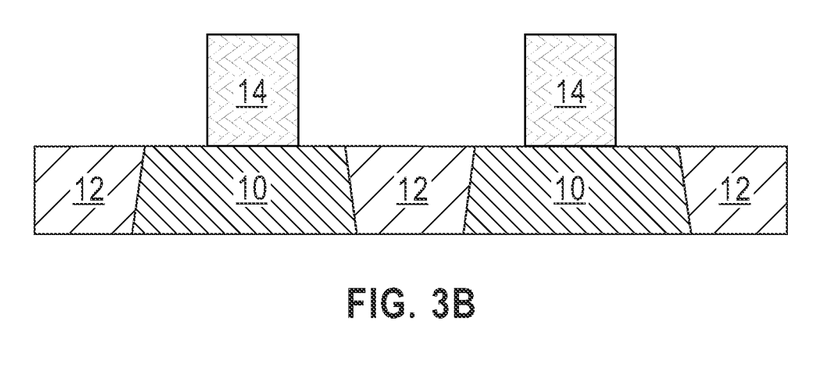

Referring now to FIG. 3A-3B, there are illustrated the exemplary structure shown in FIG. 2 after patterning the sacrificial dielectric material layer 14L into at least one sacrificial dielectric material via structure 14. The at least one sacrificial dielectric material via structure 14 is present on a portion of the first interconnect dielectric material layer 10, but not on any portion of the at least one first electrically conductive structure 12. The at least one first electrically conductive structure 12 is thus left physically exposed. The patterning includes lithography and etching as mentioned above. In cross section, the at least one sacrificial dielectric material via structure 14 has a width from 5 nm to 100 nm. The at least one sacrificial dielectric material via structure 14 has a vertical height from 20 nm to 500 nm. The at least one sacrificial dielectric material via structure 14 is configured to allow efficient shadow deposition of a layer of chiral SOT metal which is detailed herein below.

Figure 4A:
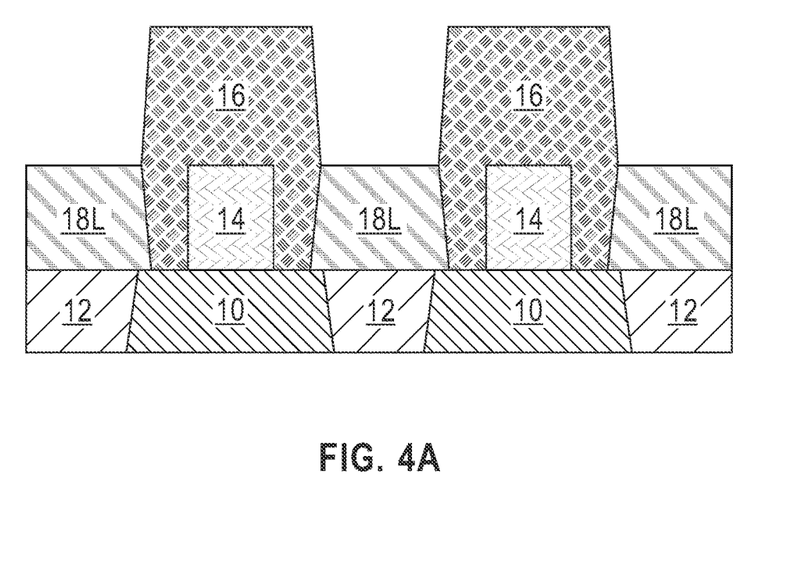
FIG. 4A is a cross sectional view of the exemplary structure shown in FIG. 3B after forming a layer of chiral SOT metal on a physically exposed surface of the at least one first electrically conductive structure utilizing the at least one sacrificial dielectric material layer via structure as a deposition shadow mask.

Referring now to FIG. 4A, there is illustrated the exemplary structure shown in FIG. 3B after forming a layer of chiral SOT metal 18L on a physically exposed surface of the at least one first electrically conductive structure 12; the layer of chiral SOT metal 18L can also extend onto portions of the first interconnect dielectric material layer 10 that are not protected by the at least one sacrificial dielectric material via structure 14. In the drawings, element 16 represents an unwanted region of the structure in which chiral SOT metal formation is undesirable. The unwanted regions includes a similar composition as that of the layer of chiral SOT metal 18L, but lacks the orientation (i.e., chirality) of the layer of chiral SOT metal 18L. It is noted that the area not protected by the least at one sacrificial dielectric material via structure 14 defines a via and the layer of chiral SOT metal 18L is formed in the via. In this deposition step, the at least one sacrificial dielectric material layer via structure 14 serves as a deposition shadow mask blocking some areas of the structure from having unwanted SOT metal deposition.

Figure 4B:
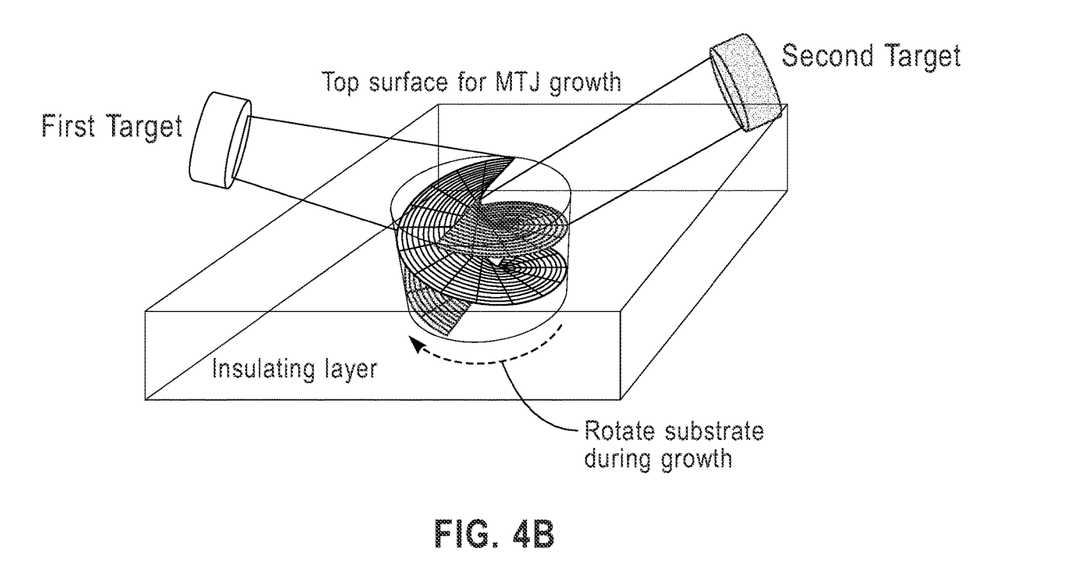
FIG. 4B is a diagram depicting the process of forming the layer of chiral SOT metal shown in FIG. 4A.

The layer of chiral SOT metal 18L is composed of a conductor that is capable of generating spin-current to assist the switching of the subsequently formed MTJ under a limited supply of charge current. The chiral via SOT structure of the present application generates a spin-current with its' spin-polarization direction significantly along the current propagation direction and has a large conversion efficiency for charge-to-spin current conversion. It is therefore efficient in creating a spin-current with axially polarized spins along the via axis. This is achieved by a multi-layered transport structure forming a spiral-pattern for both charge and spin-current conduction. The chiral-via structure is composed of a bi- or multi-layered structure in the form of A/B or A/I/B, where A=β-Ta, β-W, $Cu_xPt_{1-x}$, $Cu_{1-x}Ta_x$, $Pd_xPt_{1-x}$, $Au_xPt_{1-x}$, Pt, $Bi_2Se_3$, $WTe_2$, $PtTe_2$, $TaS_2$, $Pt_xRh_{1-x}$ or any materials known to produce large SOT charge-to-spin conversion efficiency, x is from 0 to 1; and B=Cu, Ag, Au . . . are known good spin-conductors, and with 'I' as a poor charge-conductor, but good spin-conductor such as NiO, FeOx, and other magnon-mediated spin-conducting, but charge insulating, ferro- ferri- or antiferro-magnetic materials. The I-layer in this case is used as an interface layer between A and B to facilitate spin-conduction but prevent charge-current shunting. The gradually increased tilt of the A/B or A/I/B interface normal creates a gradient for spin-current to accumulate a significant component with axial (to the spiral) spin-polarization, thus achieving high-efficiency for charge-current to axially polarized spin-current which is important for efficient switching of perpendicularly magnetized nanomagnet built above the chiral-via structure. The layer of chiral SOT metal 18L can be formed by PVD using at least two targets while rotating the substrate with the exemplary structure; this aspect of the present application is shown for example, in FIG. 4B. The rotating can be performed in a clockwise or a counterclockwise direction. The rotating is performed around a central axis that lies perpendicular to a horizontal surface of the structure shown in FIGS. 3A-3B. The two or multiple targets can include one or more of the elements mentioned above for forming the desired A/B, or A/I/B type of layered spiral-growth structure. The chirality of the layer of chiral SOT metal 18L is determined by the rotational direction of the structure during this deposition process. In the present application, the layer of chiral SOT metal 18L can be optimized to give maximum perpendicularly polarized spin-accumulation at the topmost surface. This can be achieved, for example, by controlling the incident angle and deposition rate of the various sources so as to adjust the multi-layer's interface's rate of tilt change upon spiral growth. The relative thickness of A/B or A/I/B films can also be optimized by adjusting the deposition rate of related sources. These all aim for optimizing charge-to-spin current conversion efficiency, and to maximize spin-current with a polarization in the axial direction of the spiral.

The layer of chiral SOT metal 18L has a vertical height greater than approximately 20 nm The layer of chiral SOT metal 18L has a topmost surface that at this point of the present application is typically located above a topmost surface of the least one sacrificial dielectric material via structure 14. In embodiments, and after deposition, a recess etch can be used to decrease the vertical height of the layer of chiral SOT metal 18L to adjust the vertical height of the layer of chiral SOT metal 18L.

Figure 5:
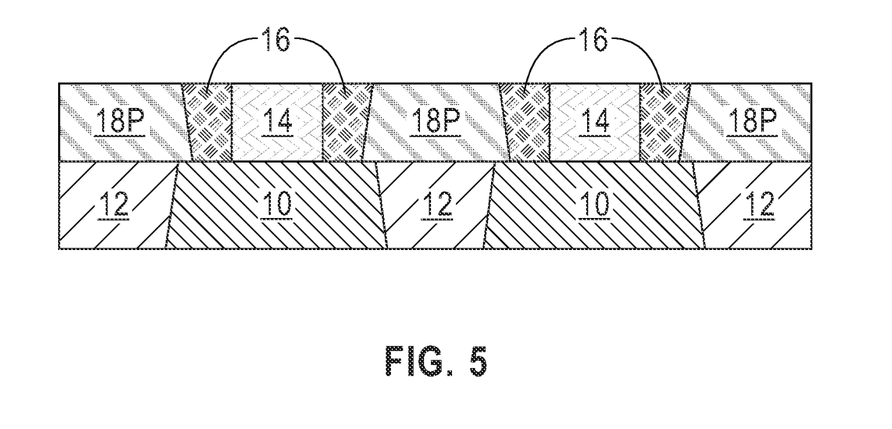
FIG. 5 is a cross sectional view of the exemplary structure shown in FIG. 4A after performing a planarization process which converts the layer of chiral SOT metal into a precursor chiral SOT metal bottom electrode.

Referring now to FIG. 5, there is illustrated the exemplary structure shown in FIG. 4A after performing a planarization process such as, for example, CMP, which converts the layer of chiral SOT metal 18L into a precursor chiral SOT metal bottom electrode 18P. The planarization process removes a portion of the layer of chiral SOT metal 18L as well as an upper portion of the unwanted region 16 and an upper portion of the least one sacrificial dielectric material via structure 14. The net result of the planarization is that each precursor chiral SOT metal bottom electrode 18P that is formed has a topmost surface that is coplanar with a remaining portion of the least one sacrificial dielectric material via structure 14.

Figure 6:
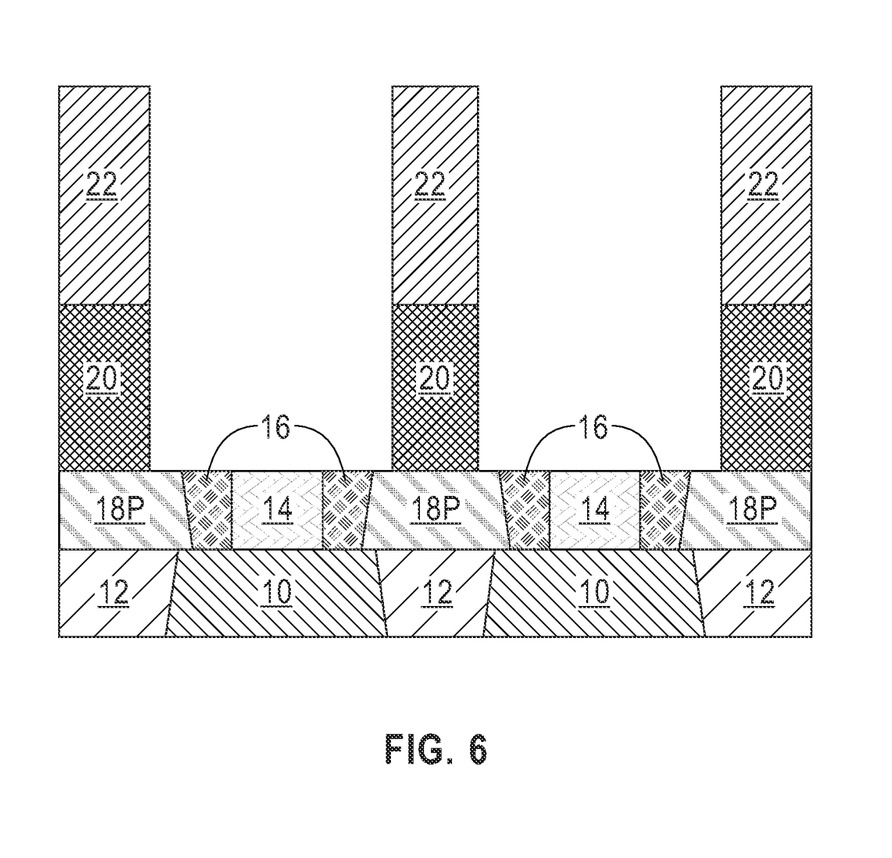
FIG. 6 is a cross sectional view of the exemplary structure shown in FIG. 5 after forming a patterned masking stack having a via patterning on the precursor chiral SOT metal bottom electrode.

Referring now to FIG. 6, there is illustrated the exemplary structure shown in FIG. 5 after forming a patterned masking stack 20/22 having a via patterning on the precursor chiral SOT metal bottom electrode. 18P. The patterned masking stack 20/22 protects some of, but not all of, the precursor chiral SOT metal bottom electrode 18P. Thus, a portion of the precursor chiral SOT metal bottom electrode 18P is unprotected as is illustrated in FIG. 6. The patterned masking stack 20/22 does not however cover the unwanted region 16.

The patterned masking stack 20/22 includes a bottom hard mask material layer 20 and a top soft mask material layer 22. In some embodiments, the bottom hard mask material layer 20 is composed of a dielectric hard mask material such as, for examples, silicon nitride or silicon oxynitride. In other embodiments, the bottom hard mask material layer 20 is composed of a metal hard mask material such as, for example, $AlO_x$. The hard mask material that provides the bottom hard mask material layer 20 can be compositionally the same as, or compositionally different than, the dielectric material that provides the least one sacrificial dielectric material via structure 14. The top soft mask material layer 22 is composed of an organic planarization layer (OPL) or any other like organic masking material. The patterned masking stack 20/22 can be formed by blanket depositing the hard mask material and then the soft mask material, and thereafter subjecting this as deposited hard mask material/soft mask material to lithographic patterning. The depositing can include, but is not limited to, CVD, PECVD or spin or coating. These blanket layers of hard mask material and soft mask material can be deposited utilizing a same, or a different, deposition process. The bottom hard mask material layer 20 can have a thickness from 20 nm to 150 nm, and the top soft mask material layer 22 can have a thickness from 50 nm to 500 nm. Other thicknesses for the bottom hard mask material layer 20 and the top soft mask material layer 22 are however contemplated and can be used in the present application.

Figure 7:
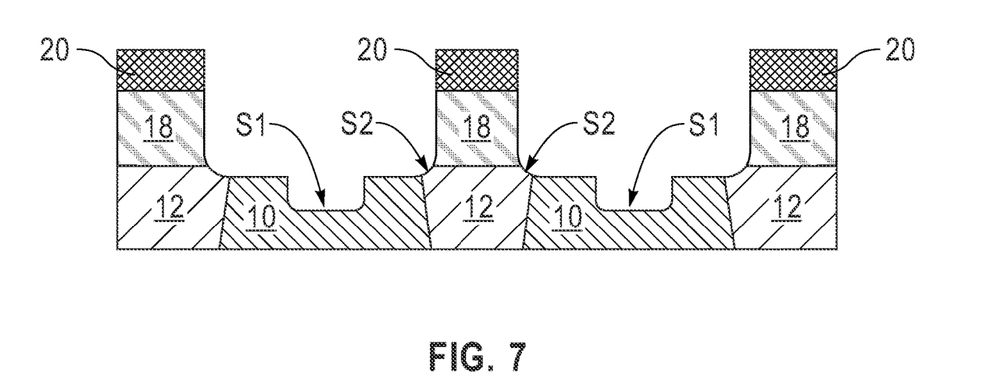
FIG. 7 is a cross sectional view of the exemplary structure shown in FIG. 6 after patterning the precursor chiral SOT metal bottom electrode to provide a chiral SOT metal bottom electrode utilizing the patterned masking stack as an etch mask, wherein the patterning removes the at least one sacrificial dielectric material via structure and a portion of the precursor chiral SOT metal bottom electrode, and wherein the patterning forms a notch surface in the first interconnect dielectric material layer.

Referring now to FIG. 7, there is illustrated the exemplary structure shown in FIG. 6 after patterning the precursor chiral SOT metal bottom electrode 18P to provide a chiral SOT metal bottom electrode 18 utilizing the patterned masking stack 20/22 as an etch mask, wherein the patterning removes the at least one sacrificial dielectric material via structure 14 and a portion of the precursor chiral SOT metal bottom electrode 18P, and wherein the patterning forms a notch surface, S1, in the first interconnect dielectric material layer 10. During this patterning step, the remaining unwanted region 16 is removed from the structure as well. Note that the notched surface, S1, is formed in an area of the first interconnect dielectric material layer 10 that is located laterally adjacent to the first electrically conductive structure 12 that now includes the chiral SOT metal bottom electrode 18 on a top surface of the first electrically conductive structure 12. As is shown in FIG. 7, this patterning step can also form a notched surface, S2, at an upper corner of the at least one first electrically conductive structure. This notching occurs due to etch rate difference between metal and dielectric.

The patterning includes a reactive ion etching or ion beam etching. During this patterning, the soft mask material layer 22 and an upper portion of hard mask material layer 20 can be removed. The resultant chiral SOT metal bottom electrode 18 has a sidewall surface that is typically perpendicular to the topmost surface of the at least one first electrically conductive structure 12. Some tapering of the sidewall of the chiral SOT metal bottom electrode 18 can however occur. The chiral SOT metal bottom electrode 18 is via structure that is typically cylindrical in shape.

Figure 8:
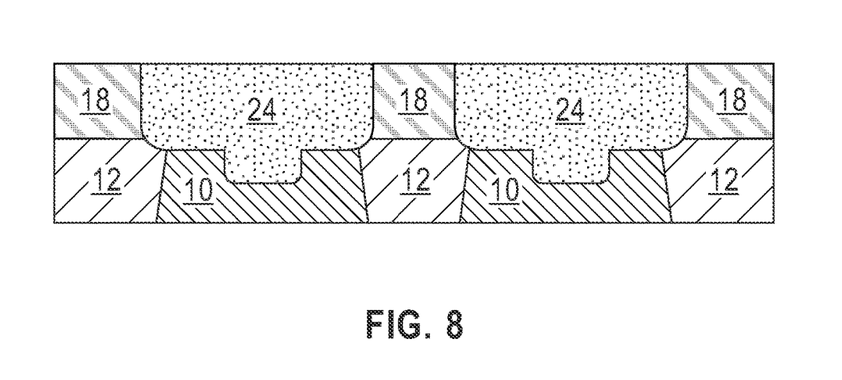
FIG. 8 is a cross sectional view of the exemplary structure shown in FIG. 7 after forming a via dielectric material structure laterally adjacent to the chiral SOT metal bottom electrode on the notched surface of the first interconnect dielectric material layer.

Referring now to FIG. 8, there is illustrated the exemplary structure shown in FIG. 7 after forming a via dielectric material structure 24 laterally adjacent to the chiral SOT metal bottom electrode 18 on the notched surface S1 of the first interconnect dielectric material layer 10; note that the via dielectric material structure 24 is also formed on non-notched surfaces of the first interconnect dielectric material layer 10 as well. The via dielectric material structure 24 can be composed of one of the dielectric materials mentioned above for the first interconnect dielectric material layer 10, or another dielectric material such as, for example, silicon nitride can be used in providing the via dielectric material structure 24. The dielectric material that provides the via dielectric material structure 24 can be composed of a compositionally same, or a compositionally different, dielectric material than that which provides the first interconnect dielectric material layer. The via dielectric material structure 24 can be formed by deposition of a dielectric material, followed by a planarization process. The deposition of the dielectric material that provides the via dielectric 24 can include CVD, PECVD, PVD, or spin-on coating. After planarization, and as is shown in FIG. 8, the via dielectric material structure 24 has a topmost surface that is coplanar with a topmost surface of the chiral SOT metal bottom electrode 18.

Figure 9:
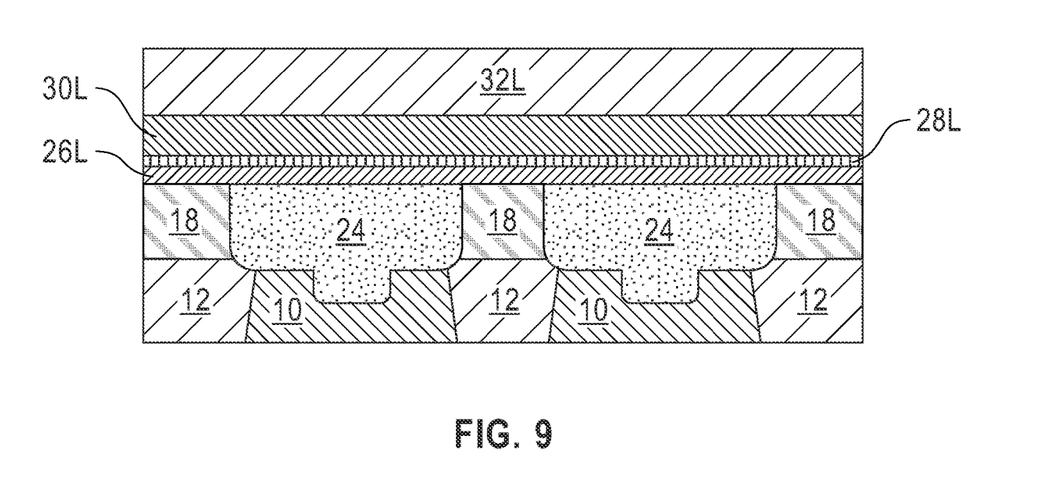
FIG. 9 is a cross sectional view of the exemplary structure shown in FIG. 8 after forming a magnetic material-containing stack including a blanket layer of a magnetic free material, a blanket layer of a tunnel barrier material, a blanket layer of a magnetic reference material, and a blanket layer of a top electrode material.

Referring now to FIG. 9, there is illustrated the exemplary structure shown in FIG. 8 after forming a magnetic material-containing stack including a blanket layer of a magnetic free material 26L, a blanket layer of a tunnel barrier material 28L, a blanket layer of a magnetic reference material 30L, and a blanket layer of a top electrode material 32L; the blanket layer of a top electrode material 32L will subsequently be patterned and serve as an etch mask for the remaining blanket layers in this magnetic material-containing stack. It is noted that other magnetic and non-magnetic materials that are typically present in MTJ structures can be formed in the magnetic material-containing stack shown in FIG. 9. As is shown in FIG. 9, the magnetic material-containing stack is located on both the via dielectric material structure 24 and each chiral SOT metal bottom electrode 18. In embodiments of the present application, the blanket layer of magnetic free material 26L forms a direct interface with the chiral SOT metal bottom electrode 18.

The blanket layer of magnetic free material 26L of the magnetic material-containing stack is composed of at least one magnetic material with a magnetization that can be changed in orientation relative to the magnetization orientation of the magnetic reference material; note that the term "magnetic free material" denotes that this magnetic layer does not have a fixed magnetization; the term does not however mean that this layer does not contain a magnetic material. Exemplary materials for the blanket layer of magnetic free material 26L includes, but are not limited to, alloys and/or multilayers of cobalt, iron, alloys of cobalt-iron, nickel, alloys of nickel-iron, and alloys of cobalt-iron-boron. The blanket layer of magnetic free material 26L can have a thickness from 0.3 nm to 3 nm; although other thicknesses are possible and can be used as the thickness of the blanket layer of magnetic free material 26L.

The blanket layer of tunnel barrier material 28L of the magnetic material-containing stack is composed of an insulator material and is formed at such a thickness as to provide an appropriate tunneling resistance. Exemplary materials for the blanket layer of tunnel barrier material 28L include magnesium oxide, aluminum oxide, and titanium oxide, or materials of higher electrical tunnel conductance, such as semiconductors or low-bandgap insulators. The thickness of the blanket layer of tunnel barrier material 28L will depend on the material selected. In one example, the blanket layer of tunnel barrier material 28L can have a thickness from 0.5 nm to 1.5 nm; although other thicknesses are possible as long as the thickness of the blanket layer of tunnel barrier material 28L provides an appropriate tunneling resistance.

The blanket layer of magnetic reference material 30L has a fixed magnetization. The blanket layer of magnetic reference material 30L is composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed. The blanket layer of magnetic reference material 30L can have a thickness from 0.3 nm to 3 nm; although other thicknesses are possible and can be used as the thickness of the blanket layer of magnetic reference material 30L.

The blanket layer of top electrode material 32L is composed of an electrically conductive material such as, for example, Ta, TaN, Ti, TiN, Ru, RuN, RuTa, RuTaN, Co, CoWP, CoN, W, WN or any combination thereof. The blanket layer of top electrode material 32L can have a thickness from 5 nm to 100 nm; other thicknesses are possible and can be used in the present application as the thickness of the blanket layer of top electrode material 32L.

The magnetic material-containing stack 26L/28L/30L/32L described above, and as is illustrated in FIG. 9, can be formed utilizing one or more deposition processes including, but not limited to, CVD, PECVD, PVD, ALD (including plasma enhanced ALD) or sputtering.

Figure 10:
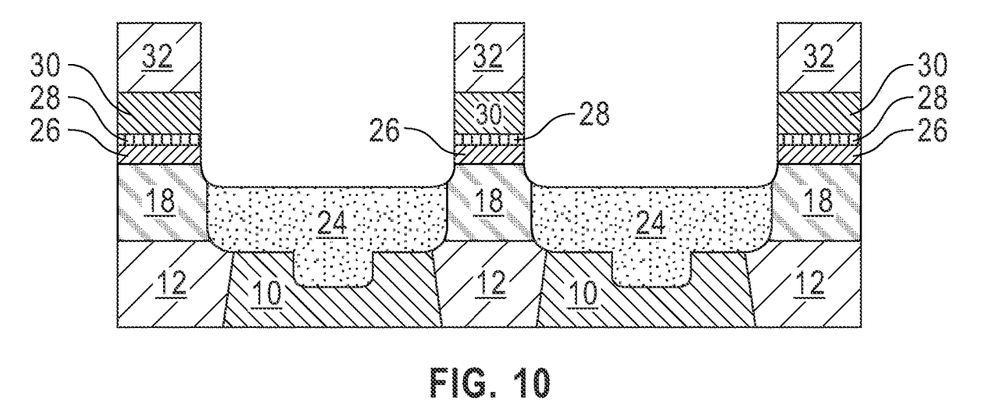

Referring now to FIG. 10, there is illustrated the exemplary structure shown in FIG. 9 after patterning the magnetic material-containing stack to provide a patterned stack that is composed of a remaining unetched portion of the blanket layer of the magnetic free material 26L (hereinafter referred to as a magnetic free layer 26), a remaining unetched portion of the blanket layer of the tunnel barrier material 28L (hereinafter referred to as a tunnel barrier layer 28), a remaining unetched portion of the blanket layer of the magnetic reference material 30L (hereinafter referred to as a magnetic reference layer 30), and a remaining unetched portion of the blanket layer of the top electrode material 32L (hereinafter referred to as a top electrode 32). In this embodiment, the magnetic free layer 26L has a width that is smaller than a width of the chiral SOT metal bottom electrode 18; note that the width of the chiral SOT metal bottom electrode 18 is an average width of that electrode. The combination of the magnetic free layer 26, the tunnel barrier layer 28 and the magnetic reference layer 30 provides a MTJ structure that is positioned between top electrode 32 and the chiral SOT metal bottom electrode 18.

This patterning includes a lithographic process in which a patterned resist (not shown) is formed on a surface of the blanket layer of top electrode material 32L. The patterned resist can be formed by deposition of a photoresist material, exposing the photoresist material to a desired pattern of irradiation, and developing the exposed photoresist material. The patterned resist protects a portion of the blanket layer of top electrode material 32L, while leaving other portions of the blanket layer of top electrode material 32L physically exposed. The physically exposed portions of the blanket layer of top electrode material 32L are removed in an initial transfer etch. After the initial transfer etch, the patterned resist is removed utilizing a conventional resist removal process such as, for example, ashing. The patterning continues utilizing another etch in which the top electrode 32 severs as an etch mask for the remaining patterning process. This other etch stops on a sub-surface of the via dielectric material structure 24. The term "sub-surface" denotes a surface of a material that is located between a topmost surface and a bottom surface of the material. This other etch removes remaining portions of the magnetic material-containing stack that are not covered by the top electrode 32, as well as an upper portion of the via dielectric material structure 24. In some embodiments, this etch can also remove a portion of the chiral SOT metal bottom electrode 18 that is not protected by the top electrode 32. The transfer etch and the subsequently performed etch can include ion beam etching, reactive ion beam etching or any combination thereof. The transfer etch can be the same as, or different from, the other etch used in this patterning step. For example, the transfer etch can include reactive ion etching, and the other etch can include ion beam etching.

In some embodiments of the present application, the exemplary structure shown in FIG. 10 can be subjected to an oxygen treatment process or any other gas treatment process so as to remove any unwanted metallic particles that may have redeposited on the sidewalls of the MTJ structure during this patterning.

The top electrode 32 and the underlying MTJ structure 26/28/30 are typically cylindrical in shape. In some embodiments of the present application, the top electrode 32 and the underlying MTJ structure 26/28/30 typically have a same width. Thus, the outermost sidewalls of the top electrode 32 and the underlying MTJ structure 26/28/30 are typically vertically aligned to each other. In other embodiments of the present application, the top electrode 32 and the underlying MTJ structure 26/28/30 can have different widths so as to provide some tapering in the outermost sidewall of the stack containing the top electrode 32 and the underlying MTJ structure 26/28/30.

Figure 11:
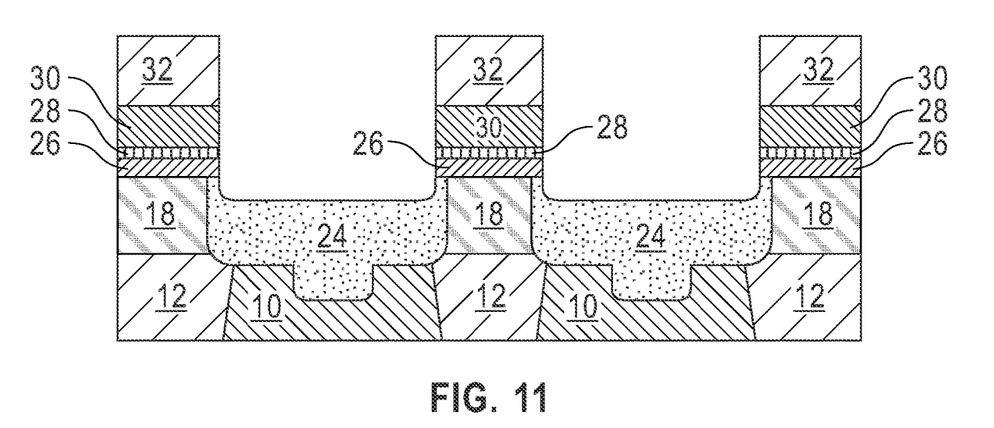
FIG. 11 is a cross sectional view of another exemplary structure processed in accordance with the steps illustrated in FIGS. 1-10 in which the magnetic free layer has a width that is greater than a width of the chiral SOT metal bottom electrode.

Referring now to FIG. 11, there is illustrated another exemplary structure processed in accordance with the steps illustrated in FIGS. 1-10 in which the magnetic free layer 26 has a width that is greater than a width of the chiral SOT metal bottom electrode 18; again the width of the chiral SOT metal bottom electrode 18 is an average width. In this embodiment, the magnetic free layer 26 overhangs the outermost sidewall the chiral SOT metal bottom electrode 18 and the via dielectric material structure 24 is present under the overhanging portion of the magnetic free layer 26. This structure can be formed by ion beam etching, reactive ion etching or a combination of both etching processes.

Figure 12:
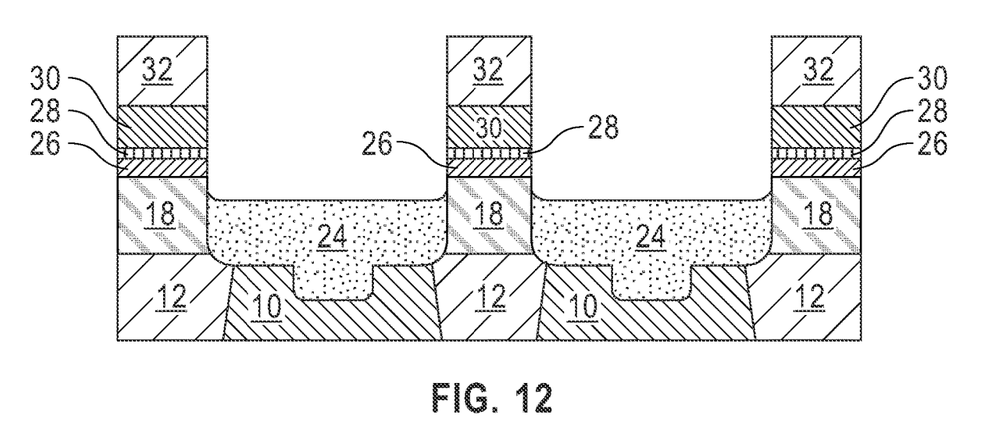
FIG. 12 is a cross sectional view of yet another exemplary structure processed in accordance with the steps illustrated in FIGS. 1-10 in which the magnetic free layer has a width that is substantially equal to a width of the chiral SOT metal bottom electrode.

Referring now to FIG. 12, there is illustrated yet another exemplary structure processed in accordance with the steps illustrated in FIGS. 1-10 in which the magnetic free layer has a width that is substantially equal to (i.e., ±5%) a width (i.e., average width) of the chiral SOT metal bottom electrode 18. This structure can be formed by ion beam etching, reactive ion etching or a combination of both etching processes.

Figure 13:
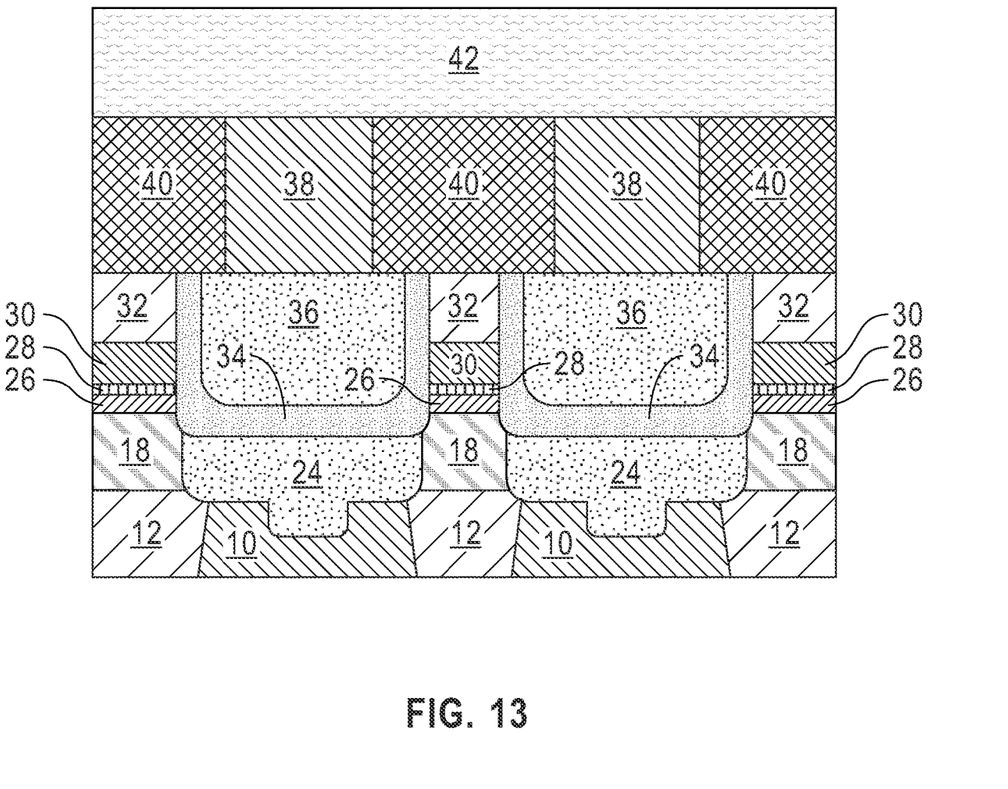
FIG. 13 is a cross sectional view of the exemplary structure shown in FIG. 10 after further MRAM device processing.

Referring now to FIG. 13, there is illustrated the exemplary structure shown in FIG. 10 after further MRAM device processing. The further MRAM device processing can also be performed on the exemplary structures illustrated in FIGS. 11 and 12. The further MRAM device processing including forming encapsulation layer 34. The encapsulation layer 34 laterally surrounds the top electrode 32, the MTJ structure 26/28/30 and any exposed upper portion of the chiral SOT metal bottom electrode 18 and is present on top of the via dielectric material structure 24. The encapsulation layer 34 is formed by deposition (e.g., CVD, PECVD, PVD, ALD or spin-on coating) of an encapsulation material (typically a dielectric material), followed by a planarization process that removes the as deposited encapsulation material that is formed on top of the top electrode 32. In one embodiment, the encapsulation material is silicon nitride. In another embodiment, the encapsulation material is a dielectric material that contains atoms of silicon, carbon and hydrogen. In some embodiments, and in addition to atoms of carbon and hydrogen, the encapsulation material can include atoms of at least one of nitrogen and oxygen. In other embodiments, and in addition to atoms of silicon, nitrogen, carbon and hydrogen, the encapsulation material can include atoms of boron. In one example, the encapsulation layer 34 can be composed of an nBLOK dielectric material that contains atoms of silicon, carbon, hydrogen, nitrogen and oxygen. In alternative example, the encapsulation layer 34 can be composed of a SiBCN dielectric material that contains atoms of silicon, boron, carbon, hydrogen, and nitrogen. The encapsulation layer 34 can have a thickness from 10 nm to 200 nm. Other thicknesses are possible and can be employed as the thickness of the encapsulation layer 34.

After forming the encapsulation layer 34, a MTJ dielectric fill material 36 is formed on the encapsulation layer 34 and laterally adjacent to the top electrode 32 and MTJ structure 26/28/30. The dielectric MTJ dielectric fill material 36 can include one of the dielectric materials mentioned above for the via dielectric material structure 24. The dielectric material that provides the MTJ dielectric fill material 36 can be compositionally the same as, or compositionally different from, the dielectric material that provides the via dielectric material structure 24. The MTJ dielectric fill material 36 can be formed by deposition of a dielectric material, followed by a planarization process. Note that in embodiments of the present application, this planarization process is used to remove both the encapsulation material and the dielectric material from on top of the top electrode. The MTJ dielectric fill material 36 has a topmost surface that is coplanar with a topmost surface of the top electrode 32.

The further MRAM device processing also include forming a second interconnect dielectric material layer 38 having at least one second electrically conductive structure 40 embedded therein and contacting a surface of the top electrode 32, an thereafter forming a third interconnect dielectric material 42 on top of the second interconnect dielectric material 38 and the at least one second electrically conductive structure 40; the forming of the third interconnect dielectric material 42 can be omitted in some embodiments of the present application. The second interconnect dielectric material layer 38 can include one of the dielectric materials mentioned above for the first interconnect dielectric material layer 10. The dielectric material that provides the second interconnect dielectric material layer 38 can be compositionally the same as, or compositionally different from, the dielectric material that provides the first interconnect dielectric material layer 10. The second interconnect dielectric material layer 38 can be formed utilizing one of the deposition processes mentioned above for forming the first interconnect dielectric material layer 10.

The at least one second electrically conductive structure 40 is composed of one of the electrically conductive materials mentioned above for the at least one first electrically conductive structure 12 In some embodiments, a diffusion barrier liner (not shown) can be formed along the sidewall and a bottom wall of the second electrically conductive structure 40. In some embodiments, no diffusion barrier liner is present. The diffusion barrier liner is composed of a diffusion barrier material as defined above. The at least one second electrically conductive structure 40 and, if present, the diffusion barrier liner, can be formed as described above in providing the exemplary structure shown in FIG. 1. The at least one second electrically conductive structure 40 can have a width that is larger than, smaller than, or equal to, a width of the top electrode 32. In some embodiments and as is shown in FIG. 13, individual (in the illustrated embodiment three) second electrically conductive structures 40 are formed, each individual second electrically conductive structures 40 contacting a single top electrode 32. In other embodiments, a second electrically conductive structure 40 can be formed that contact two or more top electrodes 32.

When present, the third interconnect dielectric material layer 42 can include one of the dielectric materials mentioned above for the first interconnect dielectric material layer 10. The dielectric material that provides the third interconnect dielectric material layer 42 can be compositionally the same as, or compositionally different from, the dielectric material that provides the first interconnect dielectric material layer 10 and/or the dielectric material that provides the second interconnect dielectric material layer. The third interconnect dielectric material layer 42 can be formed utilizing one of the deposition processes mentioned above for forming the first interconnect dielectric material layer 10. Third electrically conductive structures (not shown) can be formed into the third interconnect dielectric material and be in contact with at least one of the second electrically conductive structures.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
   a chiral spin-orbit-torque (SOT) metal bottom electrode composed of a bi- or multi-layered structure having a spiral pattern and a tilted materials interface;
   a via dielectric material structure located laterally adjacent to the chiral SOT metal bottom electrode;
   a magnetic tunnel junction (MTJ) structure located on top of the chiral SOT metal bottom electrode, wherein a magnetic free layer of the MTJ structure is located beneath a magnetic reference layer of the MTJ; and
   a top electrode located on top of the MTJ structure.

2. The memory structure of claim 1, wherein the chiral SOT metal bottom electrode enables each of a charge current direction, a spin current direction and a spin polarization direction to be perpendicular to a horizontal surface of the chiral SOT metal bottom electrode.

3. The memory structure of claim 1, wherein the chiral SOT metal bottom electrode is a via structure.

4. The memory structure of claim 1, wherein each of the chiral SOT metal bottom electrode, the MTJ structure and the top electrode is cylindrical.

5. The memory structure of claim 1, wherein the magnetic free layer of the MTJ structure has a width that differs from a width of the chiral SOT metal bottom electrode.

6. The memory structure of claim 1, wherein the magnetic free layer of the MTJ structure has a width that is substantially equal to a width of the chiral SOT metal bottom electrode.

7. The memory structure of claim 1, further comprising an interconnect level comprising an interconnect dielectric material layer and an electrically conductive structure located beneath the chiral SOT metal bottom electrode, wherein the chiral SOT metal bottom electrode is located on a surface of the electrically conductive structure.

8. The memory structure of claim 7, wherein the interconnect dielectric material layer has a notched surface located adjacent to the electrically conductive structure, and wherein the via dielectric material structure is located on the notched surface of the interconnect dielectric material layer.

9. The memory structure of claim 1, wherein the chiral SOT metal bottom electrode is composed of a conductor that generates spin-current to assist switching of the MTJ.

10. The memory structure of claim 9, wherein the bi- or multi-layered structure is in a form of A/B or A/I/B, where A=$\beta$-Ta, $\beta$-W, $Cu_xPt_{1-x}$, $Cu_{1-x}Ta_x$, $Pd_xPt_{1-x}$, $Au_xPt_{1-x}$, Pt, $Bi_2Se_3$, $WTe_2$, $PtTe_2$, or $TaS_2$, $Pt_xRh_{1-x}$, x is from 0 to 1, and B=Cu, Ag, or Au, and I comprises NiO, FeOx, or other spin-conducting but charge-insulating ferro-ferri- or anti-ferro-magnetic materials.

11. The memory structure of claim 1, further comprising a passivation layer located on a sidewall of each of the top electrode, the MTJ structure, and the chiral SOT metal bottom electrode.

12. The memory structure of claim 11, further comprising a dielectric fill material located on the passivation layer, wherein the dielectric fill material has a topmost surface that is coplanar with a topmost surface of the top electrode.

13. The memory structure of claim 1, further comprising an interconnect dielectric material layer located above the top electrode, wherein an electrically conductive structure is embedded in the interconnect dielectric material layer, and the electrically conductive structure contacts a surface of the top electrode.

14. The memory structure of claim 13, wherein the electrically conductive structure has a width that differs from a width of the top electrode.

15. The memory structure of claim 13, wherein the electrically conductive structure has a width that equals a width of the top electrode.

* * * * *